US010842058B2

(12) United States Patent
Tanaka

(10) Patent No.: US 10,842,058 B2
(45) Date of Patent: *Nov. 17, 2020

(54) METAL FOIL FOR ELECTROMAGNETIC SHIELDING, ELECTROMAGNETIC SHIELDING MATERIAL, AND SHIELDING CABLE

(71) Applicant: JX Nippon Mining & Metals Corporation, Tokyo (JP)

(72) Inventor: Koichiro Tanaka, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 303 days.

This patent is subject to a terminal disclaimer.

(21) Appl. No.: 14/902,198

(22) PCT Filed: Jun. 30, 2014

(86) PCT No.: PCT/JP2014/067333
§ 371 (c)(1),
(2) Date: Dec. 30, 2015

(87) PCT Pub. No.: WO2015/002130
PCT Pub. Date: Jan. 8, 2015

(65) Prior Publication Data
US 2016/0374238 A1    Dec. 22, 2016

(30) Foreign Application Priority Data
Jul. 4, 2013    (JP) .................................. 2013-140287

(51) Int. Cl.
*H05K 9/00*    (2006.01)
*C25D 7/06*    (2006.01)
(Continued)

(52) U.S. Cl.
CPC ........... *H05K 9/0088* (2013.01); *B32B 15/01* (2013.01); *B32B 15/013* (2013.01);
(Continued)

(58) Field of Classification Search
CPC ....... B32B 15/08; B32B 15/01; B32B 15/013; B32B 15/015; B32B 15/017;
(Continued)

(56) References Cited

U.S. PATENT DOCUMENTS 6,943,288 B1    9/2005 Miska
7,063,767 B1    6/2006 Tyson et al.
(Continued)

FOREIGN PATENT DOCUMENTS

EP    2484812    8/2012
EP    2542043 A1    1/2013
(Continued)

OTHER PUBLICATIONS

Machine Translation, Imamura et al., JP 2008-274417, Nov. 2008.*
(Continued)

*Primary Examiner* — Michael E. La Villa
(74) *Attorney, Agent, or Firm* — Jenkins, Wilson, Taylor & Hunt, P.A.

(57) ABSTRACT

A metal foil for electromagnetic shielding, comprising: a metal foil base having a thickness of exceeding 4 μm, an alloy layer having an A element configured of Sn or In and a B element group selected from the group consisting of one or more of Ag, Ni, Fe and Co formed on one or both surfaces of the base, and an underlayer having the B element group formed between the alloy layer and the base, wherein an adhesion amount of the A element is 10 to 300 μmol/dm$^2$, and a total adhesion amount of the B element group is 40 to 900 μmol/dm$^2$.

17 Claims, 2 Drawing Sheets

(51) Int. Cl.
| | |
|---|---|
| B32B 15/01 | (2006.01) |
| C23C 28/00 | (2006.01) |
| B32B 15/08 | (2006.01) |
| C25D 5/10 | (2006.01) |
| C25D 5/50 | (2006.01) |
| C23C 28/02 | (2006.01) |
| C25D 5/12 | (2006.01) |
| B32B 15/20 | (2006.01) |
| B32B 15/04 | (2006.01) |
| B32B 15/18 | (2006.01) |
| C23C 30/00 | (2006.01) |
| C25D 1/04 | (2006.01) |
| C25D 3/56 | (2006.01) |
| C25D 3/12 | (2006.01) |
| C25D 3/20 | (2006.01) |
| C25D 3/30 | (2006.01) |
| C25D 3/38 | (2006.01) |
| C25D 3/22 | (2006.01) |

(52) U.S. Cl.
CPC .......... *B32B 15/015* (2013.01); *B32B 15/017* (2013.01); *B32B 15/018* (2013.01); *B32B 15/04* (2013.01); *B32B 15/043* (2013.01); *B32B 15/08* (2013.01); *B32B 15/18* (2013.01); *B32B 15/20* (2013.01); *C23C 28/00* (2013.01); *C23C 28/02* (2013.01); *C23C 28/021* (2013.01); *C23C 28/023* (2013.01); *C23C 30/00* (2013.01); *C23C 30/005* (2013.01); *C25D 5/10* (2013.01); *C25D 5/12* (2013.01); *C25D 5/50* (2013.01); *C25D 5/505* (2013.01); *C25D 7/06* (2013.01); *C25D 7/0614* (2013.01); *H05K 9/00* (2013.01); *H05K 9/0081* (2013.01); *H05K 9/0084* (2013.01); *H05K 9/0098* (2013.01); *C25D 1/04* (2013.01); *C25D 3/12* (2013.01); *C25D 3/20* (2013.01); *C25D 3/22* (2013.01); *C25D 3/30* (2013.01); *C25D 3/38* (2013.01); *C25D 3/562* (2013.01); *Y10T 428/1266* (2015.01); *Y10T 428/1291* (2015.01); *Y10T 428/12431* (2015.01); *Y10T 428/12438* (2015.01); *Y10T 428/12569* (2015.01); *Y10T 428/12611* (2015.01); *Y10T 428/12618* (2015.01); *Y10T 428/12681* (2015.01); *Y10T 428/12687* (2015.01); *Y10T 428/12694* (2015.01); *Y10T 428/12708* (2015.01); *Y10T 428/12715* (2015.01); *Y10T 428/12792* (2015.01); *Y10T 428/12799* (2015.01); *Y10T 428/12861* (2015.01); *Y10T 428/12868* (2015.01); *Y10T 428/12875* (2015.01); *Y10T 428/12882* (2015.01); *Y10T 428/12889* (2015.01); *Y10T 428/12896* (2015.01); *Y10T 428/12903* (2015.01); *Y10T 428/12917* (2015.01); *Y10T 428/12924* (2015.01); *Y10T 428/12931* (2015.01); *Y10T 428/12937* (2015.01); *Y10T 428/12944* (2015.01); *Y10T 428/12951* (2015.01); *Y10T 428/12958* (2015.01); *Y10T 428/12972* (2015.01); *Y10T 428/12979* (2015.01); *Y10T 428/265* (2015.01); *Y10T 428/27* (2015.01)

(58) Field of Classification Search
CPC ..... B32B 15/018; B32B 15/04; B32B 15/043; B32B 15/18; B32B 15/20; H05K 9/0088; H05K 9/0084; H05K 9/00; H05K 9/0081; H05K 9/0098; C23C 28/021; C23C 28/02; C23C 28/00; C23C 28/023; C23C 30/00; C23C 30/005; C25D 3/20; C25D 3/22; C25D 3/30; C25D 3/38; C25D 3/562; C25D 5/12; C25D 5/505; C25D 7/0614; C25D 1/04; C25D 5/10; C25D 5/50; C25D 3/12; C25D 7/06; Y10T 428/12431; Y10T 428/12438; Y10T 428/12569; Y10T 428/12681; Y10T 428/12687; Y10T 428/12694; Y10T 428/12708; Y10T 428/12715; Y10T 428/12861; Y10T 428/12868; Y10T 428/12875; Y10T 428/12882; Y10T 428/12896; Y10T 428/12931; Y10T 428/12937; Y10T 428/12944; Y10T 428/12951; Y10T 428/12958; Y10T 428/12972; Y10T 428/12979; Y10T 428/12903; Y10T 428/1291; Y10T 428/12917; Y10T 428/12924; Y10T 428/12889; Y10T 428/12792; Y10T 428/12799; Y10T 428/27; Y10T 428/265; Y10T 428/1266; Y10T 428/12611; Y10T 428/12618

See application file for complete search history.

(56) References Cited

U.S. PATENT DOCUMENTS

| | | |
|---|---|---|
| 9,485,894 B2 | 11/2016 | Tanaka |
| 10,221,487 B2 | 3/2019 | Tanaka |
| 2002/0038790 A1 | 4/2002 | Kurii et al. |
| 2013/0192873 A1 | 8/2013 | Orikasa et al. |
| 2016/0165768 A1 | 6/2016 | Tanaka |
| 2016/0374238 A1* | 12/2016 | Tanaka .................. H05K 9/0088 |
| 2018/0216238 A1 | 8/2018 | Tanaka |

FOREIGN PATENT DOCUMENTS

| | | |
|---|---|---|
| EP | 2581220 A1 | 4/2013 |
| EP | 3007533 | 4/2016 |
| JP | 2002-088496 | 3/2002 |
| JP | 2003-201597 | 7/2003 |
| JP | 2005-281794 | 10/2005 |
| JP | 2008-199051 | 8/2008 |
| JP | 2008-274417 | 11/2008 |
| JP | 2010-236041 | 10/2010 |
| JP | 2012-020528 A | 2/2012 |
| JP | 2012-199291 | 10/2012 |
| JP | 2013-007092 | 1/2013 |
| JP | 5497949 B1 | 5/2014 |
| JP | 5534627 B1 | 7/2014 |
| TW | M244724 | 9/2004 |
| WO | WO 2009/144973 | 12/2009 |
| WO | WO 2011/040280 | 4/2011 |
| WO | WO-2012/036200 A1 | 3/2012 |
| WO | WO-2013/105520 A1 | 7/2013 |
| WO | WO 2015/001817 A1 | 1/2015 |
| WO | WO 2015/181970 A1 | 12/2015 |

OTHER PUBLICATIONS

Certificate of experimental result submitted at the same time as remarks with Article 34 amendment filed in PCT/JP2014-067333 dated Aug. 18, 2014 (Translation).

International Search Report corresponding to International Application No. PCT/JP2014/067333 dated Sep. 30, 2014.

Remarks submitted with Article 34 filed in PCT/JP2014-06733 [undated] (Translation).

International Search Report corresponding to International Application No. PCT/JP2014/053976 dated Apr. 1, 2014.

Notification of Transmittal of Translation of the International Preliminary Report on Patentability (Chapter I or Chapter II) corresponding to International Application No. PCT/JP2014/053976 dated Jan. 14, 2016.

(56) References Cited

OTHER PUBLICATIONS

Notification of Transmittal of Translation of the International Preliminary Report on Patentability corresponding to International Application No. PCT/JP2014/067333 dated Jan. 7, 2016.
Notice of Allowance corresponding to U.S. Appl. No. 14/902,188 dated Jul. 6, 2016.
International Search Report corresponding to Japanese Application No. PCT/JP2014/064474 dated Aug. 19, 2014.
JIS-Z2371 (1994) Methods of Neutral Salt Spray Testing. Japanese Industrial Standard 1-25.
Notification of Transmittal of Translation of the International Preliminary Report on Patentability corresponding to Japanese Application No. PCT/JP2014/064474 dated Dec. 1, 2016.
Communication of the Extended European Search Report corresponding to European patent application No. PCT/JP2014053976 dated Mar. 1, 2017.
Communication of the Extended European Search Report corresponding to European patent application No. PCT/JP2014067333 dated Feb. 28, 2017.
European Search Report corresponding to European Patent Application No. 14893424.3-1103/3150746 PCT/JP2014064474 dated Jun. 4, 2018.
Notice of Allowance corresponding to U.S. Appl. No. 15/314,808 dated Oct. 11, 2018.

\* cited by examiner

[Fig.1]
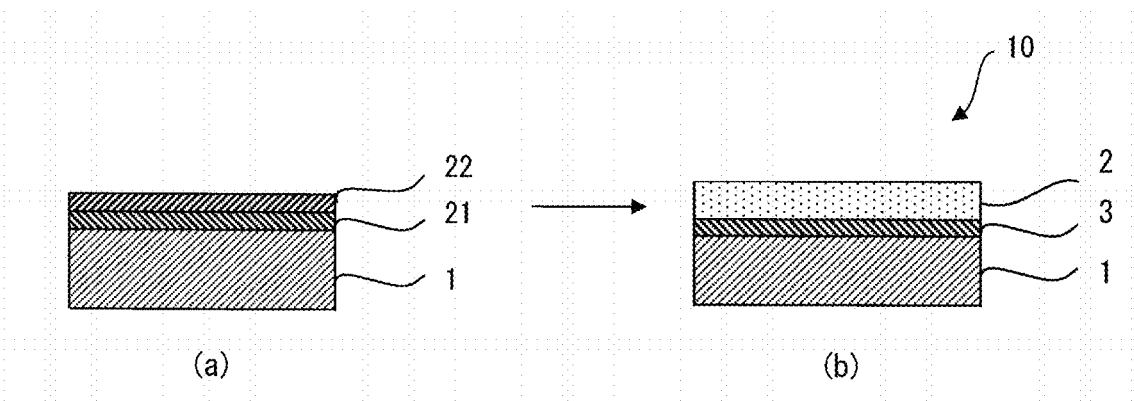
[Fig.2]
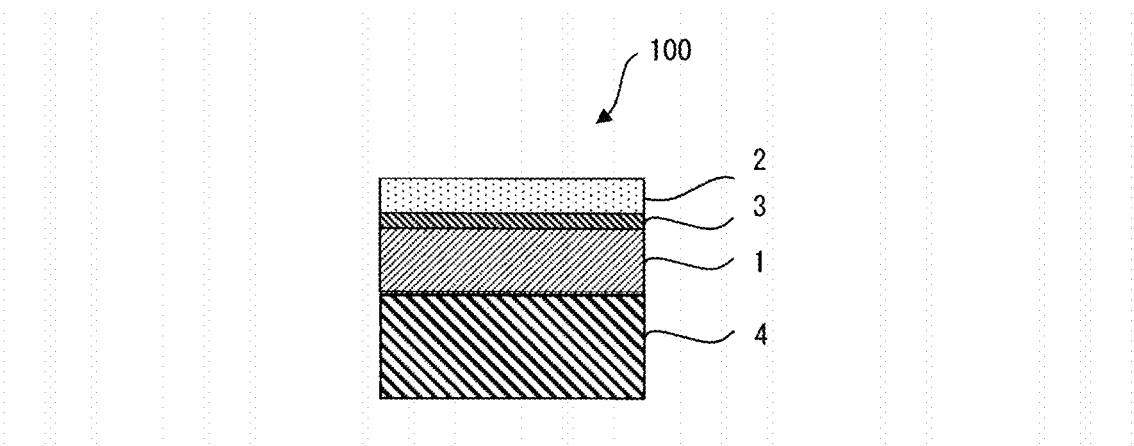
[Fig.3]

[Fig.4]
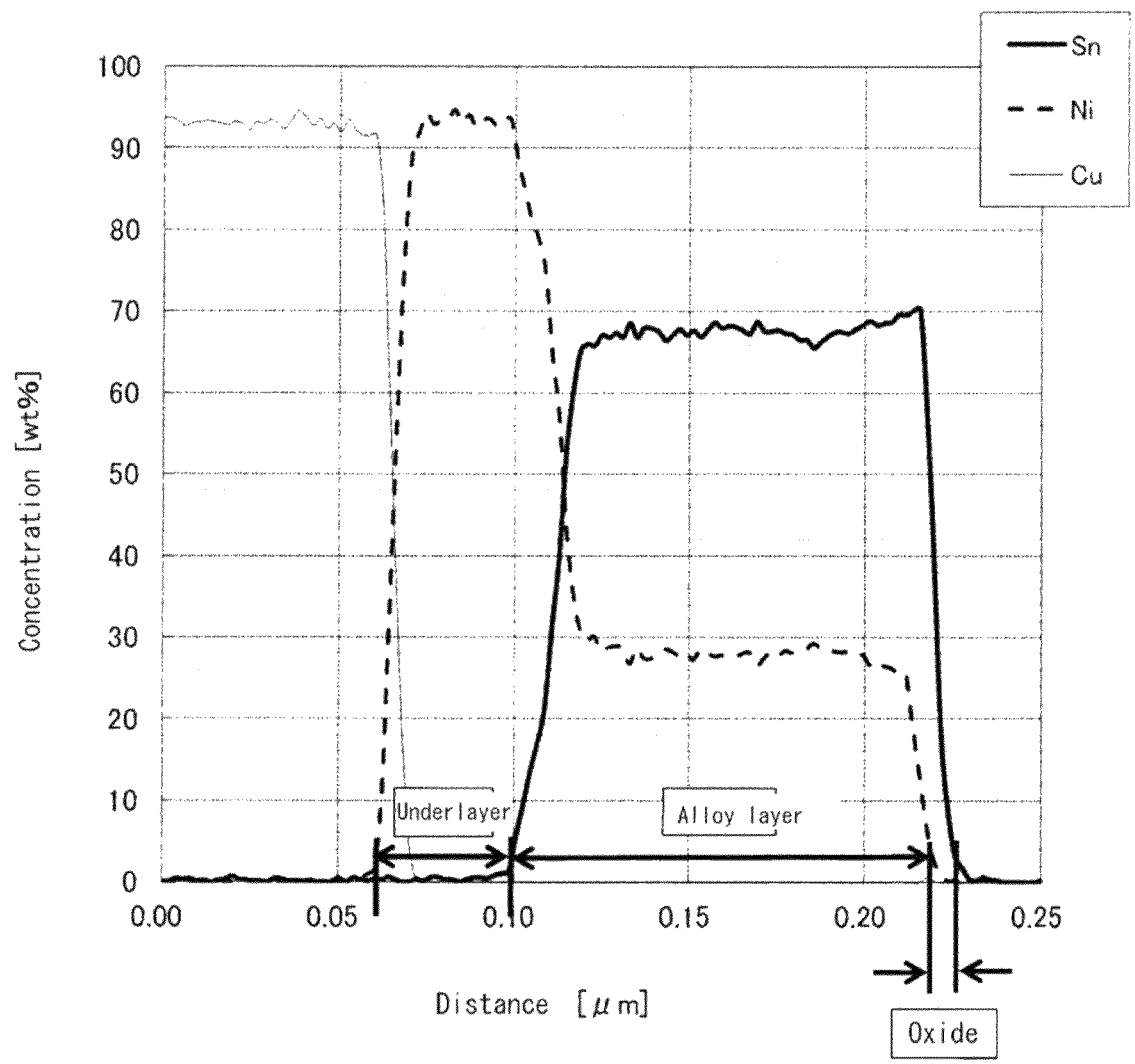

METAL FOIL FOR ELECTROMAGNETIC SHIELDING, ELECTROMAGNETIC SHIELDING MATERIAL, AND SHIELDING CABLE

FIELD OF THE INVENTION

The present invention relates to a metal foil used for an electromagnetic shielding material by laminating a resin layer or a resin film, an electromagnetic shielding material and a shielding cable using the same.

DESCRIPTION OF THE RELATED ART

An Sn plated film has characteristics of excellent corrosion resistance, good solderability, and low contact resistance. Accordingly, the Sn plated film, which is provided by plating Sn on a metal, e.g., copper, foil, is used as a composite material for an electromagnetic shielding material of a vehicle.

The composite material has a structure having a base of copper or a copper alloy foil, a resin layer or film laminated on one surface of the base, and an Sn plated film formed on the other surface thereof (see Patent Literature 1).

Also, a multilayer plating aluminum (alloy) foil has been developed by forming a zincate treated layer, a nickel electroplated layer, or a Tin electroplated layer on a surface of aluminum or an aluminum alloy foil, thereby improving moisture resistance and corrosion resistance (see Patent Literature 2).

PRIOR ART DOCUMENTS

Patent Literatures

[Patent Literature 1] PCT Patent Publication WO 2009/144973
[Patent Literature 2] Japanese Unexamined Patent Publication (Kokai) 2003-201597

SUMMARY OF THE INVENTION

Problems to be Solved by the Invention

However, an electromagnetic shielding material used in an outdoor environment including a vehicle application requires a severe corrosion resistance, and also requires a resistance to a corrosive gas such as NOx and SOx. In addition, as the electromagnetic shielding material will be used in a high temperature environment, e.g., in an engine room, the electromagnetic shielding material also requires a thermal resistance.

The present invention is made to solve the above-mentioned problems. An object of the present invention is to provide a metal foil for electromagnetic shielding, an electromagnetic shielding material and a shielding cable having excellent corrosion resistance and thermal resistance as compared with a Sn plating in the related art.

Means for Solving the Problem

Through diligent studies, the present inventors have succeeded in improving a corrosion resistance and a thermal resistance as compared with the Sn plating in the related art by forming an alloy layer including predetermined elements on a surface of a metal foil.

To achieve the above object, the present invention provides a metal foil for electromagnetic shielding, comprising: a metal foil base having a thickness of exceeding 4 µm, an alloy layer having an A element composed of Sn or In and a B element group selected from the group consisting of one or more of Ag, Ni, Fe and Co formed on one or both surfaces of the base, and an underlayer having the B element group formed between the alloy layer and the base, wherein an adhesion amount of the A element is 10 to 300 µmol/dm$^2$, and a total adhesion amount of the B element group is 40 to 900 µmol/dm$^2$.

Preferably, the alloy layer is an intermetallic compound.
Preferably, the alloy layer further includes a C element group selected from the group consisting of one or more of P, W, Fe and Co.
Preferably, a total content of the C element group to the entire alloy layer is 40 wt % or less.
Preferably, a total content of Cu, Al and Zn included in the alloy layer is 10 wt % or less.
Preferably, an oxide is formed on the surface of the alloy layer.
Preferably, the base is composed of gold, silver, platinum, stainless steel, iron, nickel, zinc, copper, a copper alloy, aluminum or an aluminum alloy.
Preferably, the base is aluminum or the aluminum alloy, and wherein a Zn layer is formed between the base and the underlayer.

The present invention provides an electromagnetic shielding material, comprising the metal foil for electromagnetic shielding according to any one of claims 1 to 8, and a resin layer laminated on one surface of the metal foil.

Preferably, the resin layer is a resin film.

The present invention provides a shielding cable shielded by the electromagnetic shielding material.

Effects of the Invention

According to the present invention, there is provided a metal foil for electromagnetic shielding, an electromagnetic shielding material and a shielding cable having excellent corrosion resistance as compared with Sn plating in the related art.

BRIEF DESCRIPTION OF THE DRAWING

FIG. 1 A cross-sectional view showing a metal foil for electromagnetic shielding according to a first embodiment of the present invention.
FIG. 2 A cross-sectional view showing an electromagnetic shielding material according to the present invention.
FIG. 3 A view showing a cross-sectional image of a sample in Example 4 by a STEM.
FIG. 4 A graph showing a line analysis result of a sample in Example 4 by a STEM.

DESCRIPTION OF THE EMBODIMENTS

Embodiments of the present invention will be described below. The symbol "%" herein refers to % by mass, unless otherwise specified.

As shown in FIG. 1(*b*), a metal foil for electromagnetic shielding according to a first embodiment of the present invention 10 includes a metal foil base 1, an alloy layer 2 formed on one surface of the base 1, and an underlayer 3 formed between the base 1 and the alloy layer 2.

(Base)

The base 1 may be any metal having high conductivity providing electromagnetic shielding effects. Examples of the base 1 include a foil of gold, silver, platinum, stainless steel, iron, nickel, zinc, copper, a copper alloy, aluminum or an aluminum alloy. In general, the base 1 is a copper or aluminum foil.

A method of forming the base 1 is not especially limited. For example, the base 1 may be formed by rolling or electroplating a foil. Alternatively, the base 1 may be film-formed by dry plating on a surface of a resin layer or a resin film of an electromagnetic shielding material as described later.

A thickness of the base 1 may exceed 4 μm. If the thickness of the base 1 is 4 μm or less, a shielding property with respect to a frequency as low as several tens MHz may be poor, the base 1 may be difficult to be formed by rolling or electrolysis, and a handling property may be poor. The thickness of the base 1 is preferably 5 to 100 μm, more preferably 6 to 50 μm. If the thickness of the base 1 exceeds 100 μm, flexibility may be poor, the base may be intractable in post-processing, and raw material costs may be increased.

If the copper foil is used as the base 1, a type of the copper foil is not especially limited. Typically, a rolled copper foil or an electrolytic copper foil may be used. In general, the electrolytic copper foil is produced by electrolytic depositing copper on a titanium or stainless steel drum from a sulfate copper plating bath or a cyanide copper plating bath. The rolled copper foil is produced by repeating plastic working and thermal treatment by a rolling mill roll.

As the rolled copper foil, oxygen free copper (JIS-H3100 (C1020)) or tough pitch copper (JIS-H3100 (C1100)) having a purity of 99.9% or more may be used. As the copper alloy foil, known copper alloys may be used depending on necessary strength and conductivity. Known copper alloys may be a copper alloy including 0.01 to 0.3% of tin or a copper alloy including 0.01 to 0.05% of silver, for example. In particular, Cu-0.12% Sn or Cu-0.02% Ag is often used because of excellent conductivity. For example, the rolled copper foil having conductivity of 5% or more may be used. Known electrolytic copper foils may be used.

The aluminum foil having a purity of 99.0% or more may be used. As the aluminum alloy foil, known aluminum alloys may be used depending on necessary strength and conductivity. For example, known aluminum alloys may be an aluminum alloy including 0.01 to 0.15% of Si and 0.01 to 1.0% of Fe, and an aluminum alloy including 1.0 to 1.5% of Mn.

(Alloy Layer)

The alloy layer 2 includes an A element composed of Sn or In, and a B element group selected from the group consisting of one or more of Ag, Ni, Fe and Co.

It is said that a Sn plating film is excellent in the corrosion resistance. However, the resistance to a corrosive gas such as NOx and SOx is not necessarily high.

Then, the alloy layer 2 including Sn or In and predetermined elements is formed in place of pure Sn, thereby improving the corrosion resistance and the thermal resistance.

Preferably, the alloy layer 2 is an intermetallic compound. Examples of the intermetallic compound include $Ag_3Sn$, $Ni_3Sn_4$, $FeSn_2$ and $CoSn$. The intermetallic compound has good corrosion resistance as compared with a non-equilibrium alloy layer.

If the Sn—Ni alloy layer 2 further includes one or more elements (referred to as a "C element group") selected from the group consisting of P, W, Fe and Co, the corrosion resistance of the Sn—Ni alloy layer is preferably improved. A total percentage of the C element group in the Sn—Ni alloy layer is preferably 1 to 40% by mass, more preferably 5 to 30% by mass.

A total content of Cu, Al and Zn included in the alloy layer 2 is 10 wt % or less, preferably 2 wt % or less. If the total content of Cu, Al and Zn included in the alloy layer 2 exceeds 10 wt %, the alloy layer 2 is easily oxidized and contact resistance increases. The total content of Cu, Al and Zn is a percentage of respective elements in the alloy layer 2 determined by a line analysis using a STEM (scanning transmission electron microscope) when a total of the specified elements is defined as 100%.

(Underlayer)

The underlayer 3 is composed of the B element group. The underlayer 3 prevents the elements included in the base 1 from diffusing to the alloy layer 2, such that the contact resistance is difficult to increase even if it is exposed to a high temperature environment. For example, if a copper foil is used for the base, once Cu is diffused to the alloy layer 2 and Cu in the alloy layer 2 is oxidized in air, resulting in the increased contact resistance. If an aluminum foil is used for the base and the alloy layer 2 is tried to be plated on the base, it firstly needs Zn substitution plating on the base. Because of this, Zn is diffused from the Zn plating layer to the alloy layer 2. In this case, the corrosion resistance to salt water decreases. In addition, Zn in the alloy layer 2 is oxidized in air, thereby increasing the contact resistance. Accordingly, the underlayer 3 is disposed between the Zn plating layer and the alloy layer 2 to prevent the diffusion of Zn.

That is to say, if the base 1 includes Cu, Al and Zn (for example, if the base 1 is the copper foil), the underlayer 3 is formed, thereby decreasing the amounts of Cu, Al and Zn diffused from the base 1 to the alloy layer 2.

The underlayer 3 may be composed of the alloy layer including the B element group and the C element group.

(Total Adhesion Amount)

A total adhesion amount of the A element is 10 to 300 μmol/dm², preferably 20 to 200 μmol/dm², more preferably 30 to 90 μmol/dm².

If the total adhesion amount of the A element is less than 10 μmol/dm², the alloy layer 2 is insufficiently formed, thereby decreasing the corrosion resistance of the alloy layer 2. On the other hand, if the total adhesion amount of the A element exceeds 300 μmol/dm², the alloy layer 2 may be deformed, e.g., bent, during the manufacturing process or upon assembly to an automobile, and the surface of the alloy layer 2 may be cracked, thereby decreasing the corrosion resistance, and increasing the costs, when the electromagnetic shielding material is used for an automobile cable, for example.

A total adhesion amount of the B element group is 40 to 900 μmol/dm², preferably 60 to 800 μmol/dm², more preferably 75 to 700 μmol/dm².

If the total adhesion amount of the B element group is less than 40 μmol/dm², the alloy layer 2 is insufficiently formed, thereby decreasing the corrosion resistance of the alloy layer 2. If the total adhesion amount of the B element group exceeds 900 μmol/dm², the underlayer 3 may be deformed, e.g., bent, to be cracked, thereby decreasing the corrosion resistance, and increasing the costs.

When the alloy layer 2 and the like are formed on both surfaces of the base 1, the total adhesion amount is provided by summing up the adhesion amounts of the alloy layers 2 and the base layers 3 on each of both surfaces.

Preferably, the oxide of the A element is formed on the surface of the alloy layer 2. The oxide of the A element has a high corrosion resistance. If the oxide exists on the surface of the alloy layer, the corrosion resistance of the alloy layer is further improved.

The oxide may be laminar or not laminar, and may exist on the surface of the alloy layer 2. A thickness of the oxide is preferably 1 to 50 nm, more preferably 3 to 30 nm, further more preferably 5 to 20 nm. The oxide has the contact resistance higher than that of the alloy layer 2. Therefore, if the thickness of the layer exceeds 50 nm, the contact resistance increases.

(Method of Forming Alloy Layer)

The alloy layer 2 is formed by alloy plating (wet plating), sputtering an alloy target configuring the alloy layer, vapor deposition using the components configuring the alloy layer or the like.

Alternatively, as shown in FIG. 1(a), a first plating layer 21 composed of the B element group is firstly formed on one surface of the base 1, a second plating layer 22 composed of the A element is formed on the surface of the first plating layer 21, the first plating layer 21 and the second layer 22 are thermally treated to diffuse the elements of the first plating layer 21 into the second plating layer 22, thereby forming the alloy layer 2 shown in FIG. 1(b). At this time, the thickness of the first plating layer 21 is increased to leave a part of the first plating layer 21 as the underlayer 3 after the thermal treatment. In addition, as shown in FIG. 1 (a), if the alloy layer 2 is formed by heating, the oxide is formed on the second plating layer 22 by natural oxidation upon the formation of the second plating layer 22. By subsequent alloying by heating, the oxide is left on the surface of the alloy layer 2. The oxide is effective to improve the properties such as the corrosion resistance.

Note that it is preferable that the oxygen concentration be 2% or less under the thermal treatment atmosphere in order not to form the excessive oxide on the surface of the alloy layer 2 by the thermal treatment. If the oxygen concentration exceeds 2%, the oxide is easily formed, the thickness of the oxide exceeds 50 nm or more, and the initial contact resistance may increase. The thermal treatment temperature is not especially limited. If the A element is Sn, the temperature is preferably 80 to 230° C. If the A element is In, the temperature is preferably 80 to 150° C. If the thermal treatment temperature exceeds the melting point of the A element, the A element melts to form a liquid phase, the alloying proceeds rapidly, the underlayer 3 is locally lost, and the thermal resistance and the corrosion resistance decrease. The thermal treatment time is not especially limited, but may be about 1 to 15 hours.

If the thermal treatment is insufficient, the intermetallic compound is not formed, a non-equilibrium alloy layer where the concentrations of the A element and the B element group are gradually changed in the thickness direction.

If the alloy layer 2 is formed by the method shown in FIG. 1(a), the first plating layer 21 or the second plating layer 22 including the elements easily diffused may be alloyed at a normal temperature with no thermal treatment.

It should be appreciated that the underlayer 3 and the alloy layer 2 may be directly formed by plating, etc. in this order on the surface of the base 1 with no thermal treatment. Alternatively, the underlayer 3 and the alloy layer 2 may be formed by vapor deposition, PVD, CVD or the like other than the wet plating.

The C element group may be included in the alloy layer 2 itself when the alloy layer 2 is formed. Alternatively, the C element group may be included in the underlayer 3 to form the alloy layer 2 on the surface of the underlayer 3. Thereafter, the C element group may be diffused into the alloy layer 2 by the thermal treatment.

Next, referring to FIG. 2, an electromagnetic shielding material 100 according to embodiments of the present invention will be described. The electromagnetic shielding material 100 is configured of a metal foil for electromagnetic shielding 10 and a resin layer or a resin film 4 laminated on one surface of the metal foil 10.

As the resin layer, resin such as polyimide may be used, for example. As the resin film, a film of PET (polyethylene terephthalate) or PEN (polyethylene naphthalate) may be used, for example. The resin layer and the resin film may be adhered to the metal foil with an adhesive, casted on the metal foil using molten resin with no adhesive, or thermocompression bonding a film to the metal foil. Alternatively, there may be used a film including a resin film and a copper or aluminum layer directly formed as a base thereon by PVD or CVD. Furthermore, there may be used a metallized film including a resin film, a thin copper or aluminum layer formed on the resin film by PVD or CVD as a conductive layer, and a thick metal layer formed on the conductive layer by wet plating.

Known resin layers or resin films may be used. The thickness of the resin layer or the resin film is not especially limited, but may be preferably 1 to 100 µm, more preferably 3 to 50 µm. Furthermore, if the adhesive is used, the thickness of the adhesive layer may be 10 µm or less, for example.

From a standpoint of the lighter and thinner material, the thickness of the electromagnetic shielding material 100 is preferably 1.0 mm or less, more preferably 0.01 to 0.5 mm.

EXAMPLES

Next, the present invention will be further described in detail by illustrating the following examples, but is not limited thereto.

(Base)

As the rolled copper foil, a rolled copper foil (model C1100 manufactured by JX Nippon Mining & Meals) adjusted to have a predetermined thickness was used.

As the electrolytic copper foil, non-roughened electrolytic copper foil (model JTC foil manufactured by JX Nippon Mining & Metals) having a thickness of 8 µm was used.

As the Cu metallized film, metallizing CCL (product name "MAQUINAS" manufactured by Nippon Mining & Metals) having a thickness of 8 µm was used.

As the aluminum foil, an aluminum foil (manufactured by Sun Aluminum Industries Co., Ltd.) having a thickness of 12 µm was used.

As the Al metallized film, a PET film (manufactured by TOYOBO Co., Ltd.) having a thickness of 12 µm on which aluminum having a thickness of 6 µm was vapor deposited was used.

(Alloy Layer)

The alloy layer was formed on one surface of the base. Table 1 shows a method of forming the alloy layer.

In Table 1, "plating" means that the first plating layer 21 and the second plating layer 22 are plated by the method shown in FIG. 1(a) in this order, and are thermally treated under the conditions shown in Table 1. In Table 1, "alloy plating" means that the underlayer is formed on the base by plating, and the alloy layer is then formed on the surface of the underlayer by alloy plating.

Each plating of Ni, Sn, Ag, Co, Fe, Cu, Zn and a variety of Ni alloys was formed under the following conditions.

Ni plating: a nickel sulfate bath (Ni concentration: 20 g/L, current density: 2 to 10 A/dm$^2$)

Sn plating: a tin-phenolsulfonate bath (Sn concentration: 40 g/L, current density: 2 to 10 A/dm$^2$)

Ag plating: an Ag cyanide bath (Ag concentration: 10 g/L, current density: 0.2 to 4 A/dm$^2$)

Co plating: an Ag cyanide bath (Co concentration: 20 g/L, current density: 1 to 8 A/dm$^2$)

Fe plating: a Fe sulfate bath (Fe concentration: 20 g/L, current density: 2 to 10 A/dm$^2$)

Cu plating: a Cu sulfate bath (Cu concentration: 20 g/L, current density: 2 to 10 A/dm$^2$)

Zn plating: a Zn sulfate bath (Zn concentration: 20 g/L, current density: 1 to 5 A/dm$^2$)

Ni—Sn: a pyrophosphate bath (Ni concentration 10 g/L, Sn concentration 10 g/L, current density: 0.1 to 2 A/dm$^2$)

Ni—P: a sulfate bath (Ni concentration: 20 g/L, P concentration: 20 g/L, current density: 2 to 4 A/dm$^2$)

Ni—W: a sulfate bath (Ni concentration: 20 g/L, P concentration: 20 g/L, current density: 0.1 to 2 A/dm$^2$)

Ni—Fe: a sulfate bath (Ni concentration: 20 g/L, Fe concentration: 10 g/L, current density: 0.1 to 2 A/dm$^2$)

Ni—Co: a sulfate bath (Ni concentration: 20 g/L, Co concentration: 10 g/L, current density: 0.1 to 2 A/dm$^2$)

In Table 1, "sputtering" means that Ni and Sn are sputtered in this order and thermally treated under the conditions shown in Table 1.

In Table 1, "alloy sputtering" means that Ni is sputtered to form the underlayer, and a corresponding alloy target material is then used and sputtered to from the alloy layer. As the layer formed by the alloy sputtering had a composition of the alloy itself, no thermal treatment was carried out.

The sputtering and the alloy sputtering were carried out under the following conditions:

Sputtering apparatus: a batch type sputtering apparatus (ULVAC Inc., model MNS-6000)

Sputtering conditions: ultimate vacuum 1.0×10$^{-5}$ Pa, sputtering pressure 0.2 Pa, sputtering power 50 W Target: Ni (purity 3N), Sn (purity 3N), Ni—Sn (Ni: Sn=30:70 (% by mass))

In Table 1, "vapor deposition" was carried out under the following conditions:

Vapor deposition apparatus: a vacuum vapor deposition apparatus (ULVAC Inc., model MB05-1006)

Vapor deposition conditions: ultimate vacuum 5.0×10$^{-3}$ Pa, electron beam accelerating voltage: 6 kV Vapor deposition source: Ni (purity 3 N), In (purity 3 N), Sn (purity 3N)

(Measurement of Adhesion Amount)

The resultant metal foil for electromagnetic shielding was cut into 50 mm×50 mm. A coating film of the surface was dissolved into a mixture solution of HNO$_3$ (2 wt %) and HCl (5 wt %). A metal concentration in the solution was quantified by an ICP Emission Spectrophotometer (SFC-3100 manufactured by SII Nano Technology Inc.) to calculate an adhesion amount (μmol/dm$^2$) from a metal weight per unit area.

(Determination of Layer Structure)

The resultant cross-sectional sample of the metal foil for electromagnetic shielding was subjected to a line analysis using a STEM (scanning transmission electron microscope, JEM-2100F manufactured by JOEL Ltd.) to determine a layer structure. The specified elements analyzed are A elements, B element groups, C element groups, C, S, and O. By defining the total of the above-described designated elements as 100%, a percentage (wt %) of each element was analyzed (accelerating voltage: 200 kV, measurement distance: 2 nm).

The alloy layer 2 included 5 wt % or more of the A element in total and 5 wt % or more of the B element group in total. For example, if the B element group include two elements, a total value of the respective elements is adopted.

The layer positioned at an upper side than the alloy layer 2 and including 5 wt % or more of the A element in total and 5 wt % or more of O was the oxide. The layer positioned at a lower side than the alloy layer 2 and including 5 wt % or more of the B element group in total and less than 5 wt % of the A element in total was the underlayer 3.

An average value of the percentage of Cu, Al, Zn and C elements in the alloy layer 2 as defined above was considered as a rate of content of Cu, Al, Zn and C.

Next, the resultant metal foil for electromagnetic shielding was wrapped around a pipe having a diameter of 2 mm by facing the surface of the metal foil at the alloy layer side to outside. Then, the metal foil for electromagnetic shielding was returned to the state before the wrapping. The thermal resistance, the corrosion resistance and the shielding effect were evaluated as follows:

(Thermal Resistance)

The outermost surface of the resultant metal foil for electromagnetic shielding at the alloy layer side was measured for the contact resistance after heating in air at 120° C. for 500 hours.

The contact resistance was measured by a four terminal method using an electric contact simulator CRS-1 manufactured by Yamazaki Seiki Co., Ltd. Probe: gold probe, contact load: 20 gf, bias current: 10 mA and a slide distance: 1 mm.

Excellent: the contact resistance was less than 20 mΩ

Good: the contact resistance was from 20 mΩ or more to less than 100 mΩ

Not good: the contact resistance was 100 mΩ or more

If the evaluation of the contact resistance after heating in air was excellent or good, it can be said that the thermal resistance was satisfactory.

(Corrosion Resistance)

The outermost surface of the resultant metal foil for electromagnetic shielding at the alloy layer side was measured for the contact resistance after the corrosion resistance test (a salt spray test and a gas corrosion test) without heating in air.

The measurement of the contact resistance was similar to that in the above-described thermal resistance test.

The salt spray test was according to JIS-Z2371 (temperature: 35° C., salt water component: sodium chloride, salt water concentration: 5 wt %, spray pressure: 98±10 kPa, spray time: 48 h).

Excellent: the contact resistance was less than 20 mΩ

Good: the contact resistance was from 20 mΩ or more to less than 100 mΩ

Not good: the contact resistance was 100 mΩ or more

The gas corrosion test was according to IEC60512-11-7, test method 4 (temperature: 25° C., humidity: 75%, H$_2$S concentration: 10 ppb, NO$_2$ concentration: 200 ppb, Cl$_2$ concentration: 10 ppb, SO$_2$ concentration: 200 ppb, test time: 21 days).

Excellent: the contact resistance was less than 20 mΩ

Good: the contact resistance was from 20 mΩ or more to less than 100 mΩ

Not good: the contact resistance was 100 mΩ or more

If the evaluation of the salt water spray test and the gas corrosion test was excellent or good, it can be said that the corrosion resistance was satisfactory.

(Electromagnetic Shielding Effect)

The electromagnetic shielding effect of the resultant metal foil for electromagnetic shielding was determined by a KEC (Kansai Electronic Industry Development Center) method within a measurement frequency of 50 to 100 MHz. The KEC method is to evaluate an attenuated amount (electromagnetic shielding effect) in decibels when a sample is inserted into a device so that the state that there is no sample is present in the device is set as a reference. The higher the value is, the better the electromagnetic shielding effect is.
Signal generator: SIGNAL GENERATOR SMLO2 (manufactured by ROHDE & SCHWARZ)
Spectrum analyzer: R3132 SPECTRUM ANALYZER (manufactured by ADVANTEST Corporation)

Each sample was measured by the KEC method for three times. The values were averaged. The electromagnetic shielding effect of each sample was determined by the following scales:

Good: the attenuated amount exceeded 80 dB.

Not bad: the attenuated amount exceeded 40 dB to 80 dB or less.

Bad: the attenuated amount was less than 40 dB.

If the evaluation of the electromagnetic shielding effect was Good or Not bad, there is no practical problem.

The results are shown in Table 1 and Table 2 and FIG. 3 and FIG. 4.

TABLE 1

| | Base | | | Alloy layer | | | Oxide on alloy layer [nm] | Thermal treatment | | Total deposition amount (μmol/dm2) | | |
|---|---|---|---|---|---|---|---|---|---|---|---|---|
| | Type | Thickness (μm) | Underlayer | C element group | B element group | A element | | Temperature (° C.) | Time | C element group | B element group | A element |
| Example 1 | Rolled copper foil | 8 | Ni | None | Ni | Sn | 5 | 180 | 5 h | 0 | 150 | 60 |
| Example 2 | Rolled copper foil | 8 | Ni | None | Ni | Sn | 5 | 180 | 8 h | 0 | 300 | 280 |
| Example 3 | Rolled copper foil | 8 | Ni | None | Ni | Sn | 6 | 180 | 3 h | 0 | 50 | 20 |
| Example 4 | Rolled copper foil | 8 | Ni | None | Ni | Sn | 4 | 180 | 3 h | 0 | 50 | 60 |
| Example 5 | Rolled copper foil | 8 | Ni | None | Ni | Sn | 5 | 180 | 5 h | 0 | 850 | 60 |
| Example 6 | Rolled copper foil | 8 | Ni | None | Ni | In | 2 | None | | 0 | 150 | 50 |
| Example 7 | Rolled copper foil | 8 | Co | None | Co | Sn | 5 | 180 | 8 h | 0 | 120 | 60 |
| Example 8 | Rolled copper foil | 8 | Ag | None | Ag | Sn | 4 | 180 | 8 h | 0 | 240 | 60 |
| Example 9 | Rolled copper foil | 8 | Fe | None | Fe | Sn | 6 | 180 | 8 h | 0 | 180 | 60 |
| Example 10 | Rolled copper foil | 5 | Ni | None | Ni | Sn | 5 | 180 | 5 h | 0 | 150 | 60 |
| Example 11 | Rolled copper foil | 35 | Ni | None | Ni | Sn | 5 | 180 | 5 h | 0 | 150 | 60 |
| Example 12 | Electrolytic copper foil | 8 | Ni | None | Ni | Sn | 4 | 180 | 5 h | 0 | 150 | 60 |
| Example 13 | Metallized Cu | 8.5 | Ni | None | Ni | Sn | 6 | 180 | 5 h | 0 | 150 | 60 |
| Example 14 | Al foil | 12 | Ni | None | Ni | Sn | 4 | 180 | 5 h | 0 | 150 | 60 |
| Example 15 | Metallized Al | 6 | Ni | None | Ni | Sn | 6 | 180 | 5 h | 0 | 150 | 60 |
| Example 16 | Rolled copper foil | 8 | Ni | None | Ni | Sn | 2 | None | | 0 | 168 | 64 |
| Example 17 | Rolled copper foil | 8 | Ni | None | Ni | Sn | 2 | None | | 0 | 150 | 60 |
| Example 18 | Rolled copper foil | 8 | Ni | None | Ni | Sn | 6 | 180 | 5 h | 0 | 150 | 60 |
| Example 19 | Rolled copper foil | 8 | Ni | None | Ni | Sn | 2 | None | | 0 | 150 | 60 |
| Example 20 | Rolled copper foil | 8 | NiP | P | Ni | Sn | 5 | 180 | 5 h | 20 | 150 | 60 |
| Example 21 | Rolled copper foil | 8 | NiW | W | Ni | Sn | 6 | 180 | 5 h | 15 | 150 | 60 |
| Example 22 | Rolled copper foil | 8 | NiFe | Fe | Ni, Fe | Sn | 6 | 180 | 5 h | 10 | 150 | 60 |
| Example 23 | Rolled copper foil | 8 | NiCo | Co | Ni, Co | Sn | 5 | 180 | 5 h | 10 | 150 | 60 |
| Comp-Example 1 | Rolled copper foil | 8 | Ni | None | Ni | Sn | 5 | 180 | 8 h | 0 | 300 | 320 |
| Comp-Example 2 | Rolled copper foil | 8 | Ni | None | Ni | Sn | 4 | 180 | 2 h | 0 | 150 | 5 |
| Comp-Example 3 | Rolled copper foil | 8 | Ni | None | Ni | Sn | 1 | 270 | 30 s | 0 | 1180 | 450 |
| Comp-Example 4 | Rolled copper foil | 8 | Ni | None | Ni | Sn | 4 | 180 | 2 h | 0 | 30 | 20 |
| Comp-Example 5 | Rolled copper foil | 8 | Ni | None | Ni | Sn | 5 | 180 | 5 h | 0 | 950 | 60 |
| Comp-Example 6 | Rolled copper foil | 8 | None | None | Ni | Sn | 6 | 180 | 5 h | 0 | 90 | 120 |
| Comp-Example 7 | Rolled copper foil | 8 | Partly none | None | Ni | Sn | 1 | 270 | 30 s | 0 | 100 | 65 |
| Comp-Example 8 | Rolled copper foil | 8 | None | None | Ni | Sn | 1 | None | | 0 | 35 | 60 |
| Comp-Example 9 | Metallized Cu | 4 | Ni | None | Ni | Sn | 6 | 180 | 5 h | 0 | 150 | 60 |
| Comp-Example 10 | Rolled copper foil | 8 | Cu | None | Cu | Sn | 0 | 180 | 5 h | 0 | 150 | 60 |
| Comp-Example 11 | Rolled copper foil | 8 | Ni | None | Ni | Zn | — | 180 | 5 h | 0 | 150 | 60 |

TABLE 2

| | Total content of Cu, Al, Zn in alloy layer (wt %) | Method of forming alloy layer | Thermal resistance test | | Salt spray test | | Gas corrosion test | | Electromagnetic shielding effect |
|---|---|---|---|---|---|---|---|---|---|
| | | | Contact resistance [mΩ] | Evaluation | Contact resistance [mΩ] | Evaluation | Contact resistance [mΩ] | Evaluation | |
| Example 1 | 0 | Alloy sputtering | 12 | Excellent | 10 | Excellent | 18 | Excellent | Excellent |
| Example 2 | 0 | Plating | 26 | Good | 35 | Good | 39 | Good | Excellent |
| Example 3 | 0 | Plating | 31 | Good | 36 | Good | 36 | Good | Excellent |
| Example 4 | 0 | Plating | 31 | Good | 36 | Good | 36 | Good | Excellent |

TABLE 2-continued

| | Total content of Cu, Al, Zn in alloy layer (wt %) | Method of forming alloy layer | Thermal resistance test | | Salt spray test | | Gas corrosion test | | Electromagnetic shielding effect |
|---|---|---|---|---|---|---|---|---|---|
| | | | Contact resistance [mΩ] | Evaluation | Contact resistance [mΩ] | Evaluation | Contact resistance [mΩ] | Evaluation | |
| Example 5 | 0 | Plating | 26 | Good | 32 | Good | 38 | Good | Excellent |
| Example 6 | 0 | Vapor deposition | 12 | Excellent | 10 | Excellent | 17 | Excellent | Excellent |
| Example 7 | 0 | Plating | 11 | Excellent | 10 | Excellent | 19 | Excellent | Excellent |
| Example 8 | 0 | Plating | 14 | Excellent | 11 | Excellent | 20 | Excellent | Excellent |
| Example 9 | 0 | Plating | 13 | Excellent | 11 | Excellent | 11 | Excellent | Excellent |
| Example 10 | 0 | Plating | 18 | Excellent | 15 | Excellent | 15 | Excellent | Good |
| Example 11 | 0 | Plating | 16 | Excellent | 16 | Excellent | 17 | Excellent | Excellent |
| Example 12 | 0 | Plating | 12 | Excellent | 16 | Excellent | 19 | Excellent | Excellent |
| Example 13 | 0 | Plating | 15 | Excellent | 17 | Excellent | 18 | Excellent | Excellent |
| Example 14 | 0 | Plating | 11 | Excellent | 11 | Excellent | 12 | Excellent | Excellent |
| Example 15 | 0 | Plating | 13 | Excellent | 11 | Excellent | 11 | Excellent | Good |
| Example 16 | 0 | Alloy sputtering | 17 | Excellent | 60 | Good | 60 | Good | Excellent |
| Example 17 | 0 | Alloy sputtering | 19 | Excellent | 65 | Good | 66 | Good | Excellent |
| Example 18 | 0 | Sputtering | 12 | Excellent | 66 | Excellent | 64 | Excellent | Excellent |
| Example 19 | 0 | Vapor deposition | 19 | Excellent | 65 | Good | 66 | Good | Excellent |
| Example 20 | 0 | Plating | 12 | Excellent | 16 | Excellent | 19 | Excellent | Excellent |
| Example 21 | 0 | Plating | 15 | Excellent | 12 | Excellent | 18 | Excellent | Excellent |
| Example 22 | 0 | Plating | 14 | Excellent | 11 | Excellent | 17 | Excellent | Excellent |
| Example 23 | 0 | Plating | 12 | Excellent | 16 | Excellent | 19 | Excellent | Excellent |
| Comp-Example 1 | 0 | Plating | 142 | Not good | 1000 or more | Not good | 1000 or more | Not good | Excellent |
| Comp-Example 2 | 0 | Plating | 137 | Not good | 1000 or more | Not good | 1000 or more | Not good | Excellent |
| Comp-Example 3 | 0 | Plating | 158 | Not good | 1000 or more | Not good | 1000 or more | Not good | Excellent |
| Comp-Example 4 | 0 | Plating | 191 | Not good | 1000 or more | Not good | 1000 or more | Not good | Excellent |
| Comp-Example 5 | 0 | Plating | 158 | Not good | 1000 or more | Not good | 1000 or more | Not good | Excellent |
| Comp-Example 6 | 15 | Plating | 1000 or more | Not good | 1000 or more | Not good | 1000 or more | Not good | Excellent |
| Comp-Example 7 | 12 | Plating | 1000 or more | Not good | 1000 or more | Not good | 1000 or more | Not good | Excellent |
| Comp-Example 8 | 0 | Vapor deposition | 1000 or more | Not good | 39 | Good | 47 | Good | Excellent |
| Comp-Example 9 | 0 | Plating | 14 | Excellent | 17 | Excellent | 19 | Excellent | Not good |
| Comp-Example 10 | — | Plating | 1000 or more | Not good | 1000 or more | Not good | 1000 or more | Not good | Excellent |
| Comp-Example 11 | — | Plating | 1000 or more | Not good | 1000 or more | Not good | 1000 or more | Not good | Excellent |

As apparent from Table 1 and Table 2, each Example having the base, the alloy layer including the A element and the B element group (and the C element group, as necessary) on the surface of the base, and the underlayer including the B element group (and the C element group, as necessary) between the alloy layer and the base, where the total adhesion amount of the A element is 10 to 300 μmol/dm², and the total adhesion amount of the B element group is 40 to 900 μmol/dm² was excellent in the thermal resistance, the corrosion resistance, and the electromagnetic shielding effect.

In particularly, in Examples 1 to 5, 7 to 15, 18, 20 to 23 where the alloy layer was formed by the thermal treatment at the temperature lower than the melting point of the A element, the corrosion resistance was further excellent as compared with Examples 6, 16, 17 and 19 with no thermal treatment and Example 24 with the thermal treatment at the temperature above the melting point. As described later, this is because the alloy layer is the intermetallic compound.

FIG. 3 and FIG. 4 are a cross-sectional image and a line analysis result of the sample in Example 4 by the STEM, respectively. The line analysis result reveals that X and Y layers in the cross-sectional image are the Ni—Sn alloy layer and the Ni layer, respectively.

An electron diffraction pattern of the alloy layer in each Example and Comparative Example was analyzed by a TEM (JEM-2100F manufactured by JEOL Ltd.). As a result, it was confirmed that the alloy layer in each of Examples 1 to 5, 7 to 15, 18, 20 to 23 and Comparative Examples 1, 3, 5 and 9 was the intermetallic compound.

In Comparative Examples 1 and 3 where the total adhesion amount of the A element exceeded 300 μmol/dm², the alloy layer was cracked, which decreased the thermal resistance and the corrosion resistance.

In Comparative Example 2 where the total adhesion amount of the A element was less than 10 μmol/dm², the thermal resistance and the corrosion resistance were poor.

In Comparative Example 4 where the total adhesion amount of the B element group was less than 40 μmol/dm², the thermal resistance and the corrosion resistance were poor.

In Comparative Example 5 where the total adhesion amount of the B element group exceeded 900 μmol/dm², the alloy layer was cracked, which decreased the thermal resistance and the corrosion resistance.

In Comparative Example 6 where no underlayer 3 was formed, Cu in the base was diffused into the alloy layer by the thermal treatment after plating and the Cu concentration in the alloy layer exceeded 10%, which decreased the thermal resistance and the corrosion resistance.

In Comparative Example 7 where the thermal treatment was performed at the temperature above the melting point of the A element, alloying proceeded locally and excessively, a part of the layer 21 in FIG. 1 originally for the underlayer was not left as the underlayer 3, and a part of the alloy layer was directly formed on the base. Therefore, Cu in the base was diffused into the alloy layer by the thermal treatment and the Cu concentration in the alloy layer exceeded 10%, which decreased the thermal resistance and the corrosion resistance.

In Comparative Example 8 where no underlayer 3 was formed, Cu in the base was diffused into the alloy layer after the thermal resistance test, which decreased the thermal resistance. However, in Comparative Example 8, as the thermal treatment was not performed upon the formation of the alloy layer, Cu was not diffused into the alloy layer. So, the Cu concentration in the alloy layer was less than 10%, and the corrosion resistance was therefore good.

In Comparative Example 9 where the thickness of the base was 4 μm or less, the electromagnetic shielding effect was poor.

In Comparative Example 10 where Cu was used in place of the B element group, the thermal resistance and the corrosion resistance were poor.

In Comparative Example 11 where Zn was used in place of the A element, the thermal resistance and the corrosion resistance were poor.

DESCRIPTION OF REFERENCE NUMERALS 1 metal foil
2 alloy layer
3 underlayer
4 resin layer or resin film
10 metal foil for electromagnetic shielding
100 electromagnetic shielding material

What is claimed is:

1. A metal foil for electromagnetic shielding, comprising:
a metal foil base having a thickness exceeding 4 μm, an alloy layer having an A element comprising Sn and a B element selected from the group consisting of Ag, Ni, Fe, Co and combinations thereof, formed on one or both surfaces of the metal foil base, and an underlayer comprising a B element selected from the group consisting of Ag, Ni, and Co, wherein the underlayer is formed between the alloy layer and the metal foil base, wherein
a total adhesion amount of the A element per surface is 10 to 300 μmol/dm$^2$, and a total adhesion amount of the B element per surface is 40 to 900 μmol/dm$^2$,
and wherein an oxide layer having a thickness between 1 and 50 nm and comprising the A element is formed on the outermost surface of the alloy layer.

2. The metal foil for electromagnetic shielding according to claim 1, wherein the alloy layer further includes a C element selected from the group consisting of P, W, and combinations thereof.

3. The metal foil for electromagnetic shielding according to claim 1, wherein a total content of Cu, Al and Zn included in the alloy layer is 10 wt % or less.

4. The metal foil for electromagnetic shielding according to claim 1, wherein the base is composed of gold, silver, platinum, stainless steel, iron, nickel, zinc, copper, a copper alloy, aluminum or an aluminum alloy.

5. The metal foil for electromagnetic shielding according to claim 1, wherein the base is aluminum or an aluminum alloy, and wherein a Zn layer is formed between the base and the underlayer.

6. An electromagnetic shielding material, comprising the metal foil for electromagnetic shielding according to claim 1, and a resin layer laminated on one surface of the metal foil.

7. The electromagnetic shielding material according to claim 6, wherein the resin layer is a resin film.

8. A shielding cable shielded by the electromagnetic shielding material according to claim 7.

9. A shielding cable shielded by the electromagnetic shielding material according to claim 6.

10. The metal foil for electromagnetic shielding according to claim 1, wherein the alloy layer is an intermetallic compound.

11. The metal foil for electromagnetic shielding according to claim 10, wherein the alloy layer further includes a C element selected from the group consisting of P, W, and combinations thereof.

12. The metal foil for electromagnetic shielding according to claim 11, wherein a total content of the C element to the entire alloy layer is 40 wt % or less.

13. The metal foil for electromagnetic shielding according to claim 10, wherein a total content of Cu, Al and Zn included in the alloy layer is 10 wt % or less.

14. The metal foil for electromagnetic shielding according to claim 10, wherein the base is composed of gold, silver, platinum, stainless steel, iron, nickel, zinc, copper, a copper alloy, aluminum or an aluminum alloy.

15. The metal foil for electromagnetic shielding according to claim 10, wherein the base is aluminum or an aluminum alloy, and wherein a Zn layer is formed between the base and the underlayer.

16. The metal foil for electromagnetic shielding according to claim 2, wherein a total content of the C element to the entire alloy layer is 40 wt % or less.

17. The metal foil for electromagnetic shielding according to claim 2, wherein a total content of Cu, Al and Zn included in the alloy layer is 10 wt % or less.

* * * * *